(12) United States Patent
Jameson, III et al.

(10) Patent No.: US 8,976,568 B1
(45) Date of Patent: Mar. 10, 2015

(54) CIRCUITS AND METHODS FOR PROGRAMMING VARIABLE IMPEDANCE ELEMENTS

(71) Applicant: Adesto Technologies Corporation, Sunnyvale, CA (US)

(72) Inventors: John Ross Jameson, III, Burlingame, CA (US); Michael A. Van Buskirk, Saratoga, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 212 days.

(21) Appl. No.: 13/745,711

(22) Filed: Jan. 18, 2013

Related U.S. Application Data (60) Provisional application No. 61/589,251, filed on Jan. 20, 2012.

(51) Int. Cl.
*G11C 11/00* (2006.01)
*G11C 13/00* (2006.01)

(52) U.S. Cl.
CPC .................................. *G11C 13/0002* (2013.01)
USPC ............................ 365/148; 365/153; 365/163

(58) Field of Classification Search
CPC ........... G11C 13/0004; G11C 11/5685; G11C 11/16; G11C 8/10; B82Y 10/00
USPC .......................................... 365/148, 153, 163
See application file for complete search history.

(56) References Cited

U.S. PATENT DOCUMENTS

| | | | |
|---|---|---|---|
| 7,145,791 B2 | 12/2006 | Tsushima et al. | |
| 7,167,390 B2 | 1/2007 | Ishida et al. | |
| 7,215,568 B2 | 5/2007 | Liaw et al. | |
| 7,294,875 B2 | 11/2007 | Kozicki | |
| 7,327,603 B2 | 2/2008 | Roehr | |
| 7,359,236 B2 | 4/2008 | Gilbert | |
| 7,372,716 B2 | 5/2008 | Roehr | |
| 7,426,131 B2 | 9/2008 | Gilbert | |
| 7,483,294 B2 | 1/2009 | Gilbert | |
| 7,586,776 B2 * | 9/2009 | Oh et al. .................... | 365/148 |
| 7,719,082 B2 | 5/2010 | Aratani et al. | |
| 7,738,279 B2 | 6/2010 | Slesazeck et al. | |
| 7,786,459 B2 | 8/2010 | Aratani et al. | |
| 8,036,014 B2 * | 10/2011 | Lee et al. .................... | 365/148 |
| 8,107,273 B1 | 1/2012 | Hollmer et al. | |
| 8,274,842 B1 | 9/2012 | Hollmer et al. | |
| 8,294,488 B1 | 10/2012 | Derhacobian et al. | |
| 2004/0124407 A1 | 7/2004 | Kozicki et al. | |
| 2006/0265548 A1 | 11/2006 | Symanczyk et al. | |
| 2011/0038195 A1 * | 2/2011 | Hamilton et al. .......... | 365/148 |

* cited by examiner

*Primary Examiner* — Douglas King
*Assistant Examiner* — Ajay Ojha (57) ABSTRACT

A memory device can include a plurality of memory cells each comprising at least one programmable impedance memory element; a programming circuit coupled to the memory elements and configured to apply at least one time varying pulse to memory elements to place them into one of at least two different impedance states; and a programming voltage source coupled to the programming circuit configured to generate the at least one time varying pulse; wherein the time varying pulse decreases and increases in potential while having an overall increase in one voltage polarity.

20 Claims, 8 Drawing Sheets

CIRCUITS AND METHODS FOR PROGRAMMING VARIABLE IMPEDANCE ELEMENTS

This application claims the benefit of U.S. provisional patent application Ser. No. 61/589,251, filed on Jan. 20, 2012, the contents of which are incorporated by reference herein.

TECHNICAL FIELD

The present disclosure relates generally to memory devices, and more particularly to memory devices that store data with programmable impedance elements, such as those based on one or more ion conducting layers.

BACKGROUND

A known problem with memory elements that include a solid ion conductor layer, such as conductive bridging random access memory CBRAM type elements (also called programmable metallization cells (PMCs)) can be variability in resistance response between elements and between cycles of a given device.

Figure 20A:
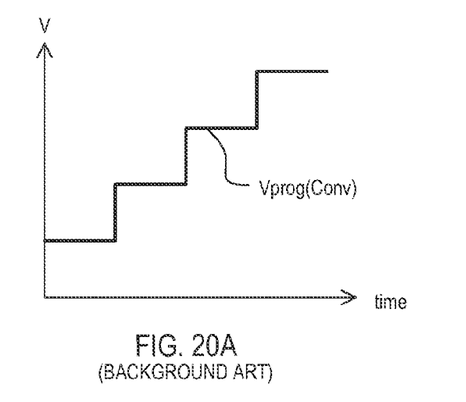
FIGS. 20A to 20E are diagrams showing conventional programming of a conductive bridging random access memory (CBRAM) element.

A conventional programming operation is shown in FIGS. 20A to 20E. FIG. 20A is a timing diagram showing a conventional programming pulse voltage (Vprog(Conv)) that can include stepped increases in potential over time.

Figure 20B:
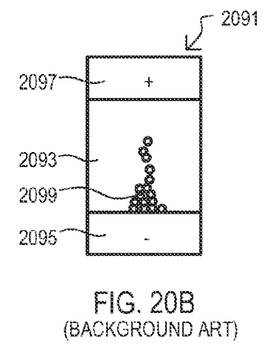
Figure 20C:
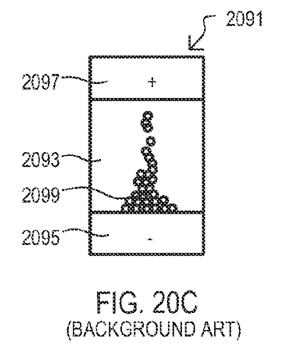
Figure 20D:
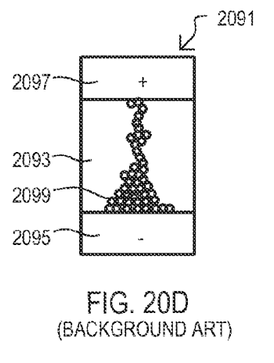

FIGS. 20B to 20D are diagrammatic representations of a CBRAM element 2091 response to one or more conventional programming pulses. A conductive filament 2099 can be formed between two electrodes (2097, 2095). FIGS. 20B to 20D show how application of a potential, like that shown in FIG. 20A, can eventually create a conductive filament 2099 through an ion conducting layer 2093.

Figure 20E:
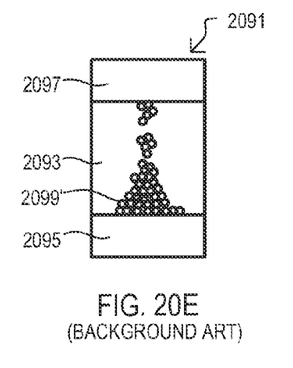

While a conventional programming operation can form an initial conductive path (shown in FIG. 20D), as shown in FIG. 20E, a filament configuration can change 2099' (i.e., narrowing or opening portions of a conductive filament), resulting in an increase in filament resistance. It is believed that such a change in filament structure can be spontaneous, or can occur in response to other electrical fields applied to the element (e.g., read disturbs, etc.).

In work unrelated to CBRAM type memory elements, physical properties of atomic sized metallic conductors/wires are summarized in Physics Reports Volume 377, Issue 81 (2003). The article shows one method of making an atomic sized metallic wires (AWs) that includes driving an STM (scanning tunneling microscope) tip into a metal sample surface, then retreating the tip, to yield a chain of atoms between tip and the sample. The article comments that by moving the tip back and forth (up and down) by small amount about the point at which the wire connects/disconnects, the conductance of the connected configuration can be made more repeatable. Evidence suggests that the atoms of such a wire (which can be Au) can have certain preferred configurations that are more stable (i.e., do not change over time) than other configurations.

The article also describes a second characteristic of atomic wires made by the STM method. When an STM tip is brought extremely close to surface, a sudden "jump to contact" is observed. This jump occurs with a complete metallic contact being suddenly formed between the tip and surface. The jump to contact of AWs is associated with the bonding force between the tip and substrate. As the tip gets very close (2 or fewer angstroms), the bonding force pulls so strongly on the tip and substrate that the atoms away from the contact point are strained, lengthening the tip a bit. Bringing the STM tip close, then far, then close etc., to the surface may allow the atoms at the tip to wiggle into a preferred configuration.

DETAILED DESCRIPTION

Embodiments described herein show devices, circuits and methods that can apply a programming pulse across a memory element that has an overall increase in potential, while at the same time having an alternating electric field component (e.g., AC component). Programming elements with such pulses may reduce variability in elements, as well as increase retention times for the elements.

The present inventors believe that one factor that may affect filament stability can be that there may be many possible configurations for a small collection of atoms (e.g., ion conductable metals) that form a conductive filament within an element. Further, such configurations may include preferred configurations that are more stable than other configurations. It is believed that application of a programming pulse having an alternating field component, as described herein, may assist in forming a filament in its preferred configuration.

It is also believed, that formation of filaments within a memory element may include physical behaviors like a "jump-to-contact" as a memory element forms a conductive filament. An alternating field component may result in ions of a filament "wiggling" into a preferred configuration due to the varying field direction.

Filaments in a preferred configuration may be more stable over time, and thus may yield better data retention times. In addition, such preferred configurations may produce impedance values (e.g., conductance/resistance, capacitance) that are more repeatable, more stable over time (better retention), more well-known and/or more well-defined as compared to conventionally programmed CBRAM elements.

In some embodiments, one or more programming pulses applied to an element can include an AC voltage on the top of a slowly ramped second voltage. The time at which the filament will tend to complete its formation may coincide with the peak of the AC signal.

The alternating field directions of a voltage near the final moment of filament formation may supply a varying force that will push and pull the atoms deeper in the filament, and perhaps surrounding the filaments, allowing the filament to gradually find a preferred configuration. In other embodiments, a programming voltage can be an AC voltage without a slower ramping component, but with an increase in its amplitude.

Embodiments also include using the same or similar approaches in dissolving a filament. In particular, an applied programming pulse can have AC-like features noted above, but with an opposite polarity to that used to form a filament.

In the various embodiments described below, like features may be referred to by the same reference character but with a first character(s) corresponding to the figure number. As understood from above, reference to a "programming" as used herein can refer to an operation that decreases an impedance of an element and/or forms conductive structures within a memory material, but can also refer to an operation that increases an impedance of an element and/or dissolves all or a portion of conductive structures within a memory material.

Figure 1:
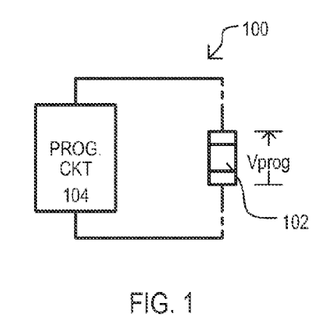
FIG. 1 is a schematic diagram of a memory device according to one embodiment.

FIG. 1 shows a memory device 100 having a programming circuit 104 and a memory element 102. A programming circuit 104 that can apply a programming voltage Vprog to a memory element 102. In some embodiments, a memory element 102 can include a memory layer formed between two electrodes. Such a memory element layer can include an ion conducting material. In particular embodiments, an ion conducting layer can include a chalcogenide and/or a metal oxide. In some embodiments, a memory element 102 can be one element of many (e.g., millions) in a memory device 100.

A programming circuit 104 can apply a programming voltage (Vprog) which, unlike a conventional programming circuit, can include an alternating electric field component. Voltage pulses (Vprog) generated by a programming circuit 104, according to particular embodiments, are described below. In some embodiments, programming operations can be applied to a selected memory element (e.g., 102), while in other embodiments, programming operations can be applied to a group of two or more such memory elements.

Figure 2:
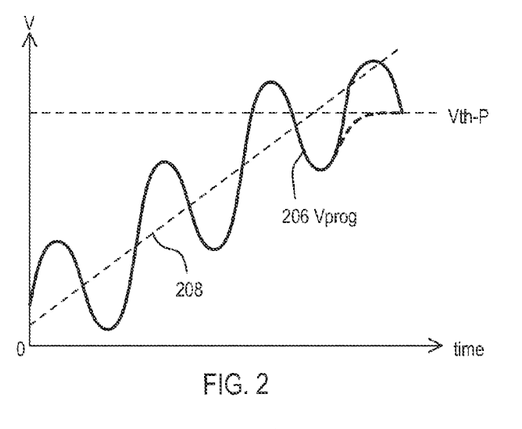
FIG. 2 is a diagram showing a programming voltage source according to an embodiment.

FIG. 2 is a diagram showing a programming voltage pulse (Vprog) 206 according to an embodiment. In FIG. 2, it is assumed that an element (e.g., 102) has a threshold voltage Vth-P. When a voltage applied across an element rises to and/or exceeds a threshold voltage (Vth-P), an impedance of the element can change.

As shown, a voltage of pulse 206 can increase and decrease in potential, while at the same time, having an overall increase in one voltage polarity (positive in this embodiment). Such an overall increase can be determined by an integral of the waveform (i.e., area under the curve).

A pulse 206 can be conceptualized as having an alternating field (e.g., AC) component added to a second, slowly increasing (e.g., DC) component (shown as 208). In the particular embodiment shown, an increasing component 208 can be a "ramping" voltage that increases during the pulse (in this embodiment, ramping at a constant rate).

In one embodiment, an element 102 is programmable by such a positive going pulse to a low resistance. A programming voltage pulse of opposite polarity can program the element 102 to a high resistance. Such an opposite polarity voltage may, or may not, have an AC-type component.

Figure 3:
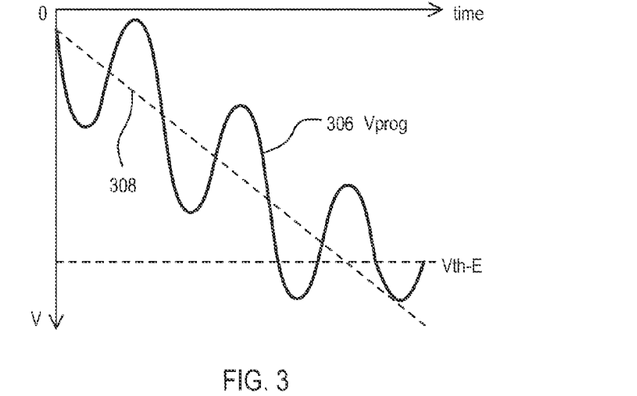
FIG. 3 is a diagram showing a programming voltage source according to another embodiment.

FIG. 3 is a diagram showing a programming voltage pulse (Vprog) 306 according to another embodiment. In FIG. 3, it is assumed that a memory element (e.g., 102) has a threshold voltage Vth-E. When a threshold voltage (Vth-E) falls to and/or below threshold voltage Vth-E, an impedance of the element can change.

FIG. 3 shows a voltage pulse like that of FIG. 2, however, a voltage pulse 306 can have an overall increase in a negative polarity.

It is understood that for all embodiments described herein that include a programming voltage pulse having an overall increase of a positive polarity, there can be a corresponding negative going counterpart, just as FIG. 3 is a negative going counterpart to FIG. 2.

It is also understood that for all embodiments described herein that include a sinusoidal shaped waveforms, alternate embodiments can include differently shaped waveforms (e.g., square wave, triangular wave, saw tooth wave, etc.).

Figure 4:
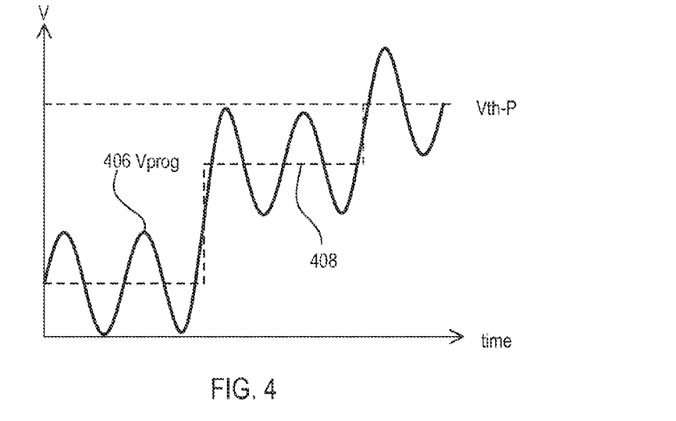
FIG. 4 is a diagram showing a programming voltage source according to another embodiment.

FIG. 4 is a diagram showing a programming voltage pulse (Vprog) 406 according to a further embodiment. In FIG. 4, it is assumed that an element has a threshold voltage Vth-P.

As in the case of FIG. 2, a voltage of pulse 406 can increase and decrease in potential, while at the same time, having an overall increase in one voltage polarity (positive in this embodiment). However, a pulse 406 can include an increasing component 408 that can have non-linear increases (in this embodiment, voltage steps).

Figure 5:
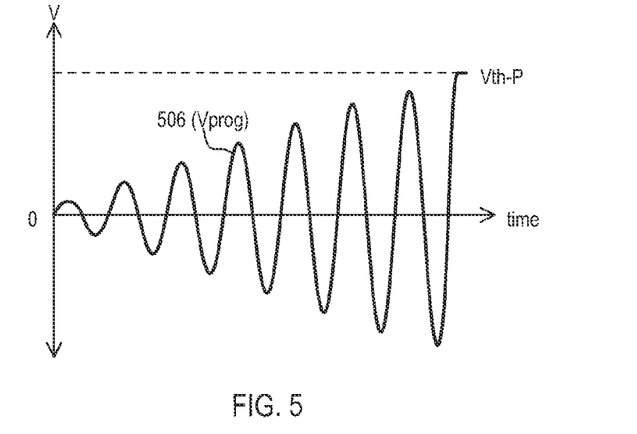
FIG. 5 is a diagram showing a programming voltage source according to another embodiment.

FIG. 5 is a diagram showing a programming voltage pulse (Vprog) 506 according to another embodiment. In FIG. 5, it is assumed that an element has a threshold voltage Vth-P.

A voltage of pulse 506 can be a substantially AC waveform with an increasing amplitude. However, a voltage pulse 506 can end with a positive polarity, for an overall increase in polarity.

Figure 6:
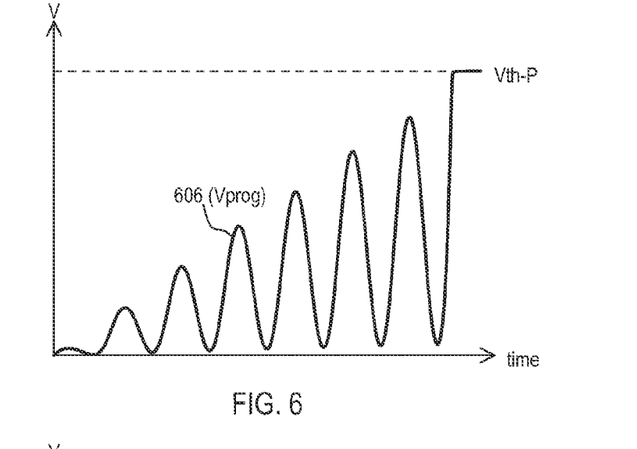
FIG. 6 is a diagram showing a programming voltage source according to another embodiment.

FIG. 6 is a diagram showing a programming voltage pulse (Vprog) 606 according to another embodiment. In FIG. 6, it is assumed that an element has a threshold voltage Vth-P.

A voltage of pulse 606 can include a sequence of positive going sections that increase in amplitude, while negative going sections have smaller amplitudes.

Figure 7:
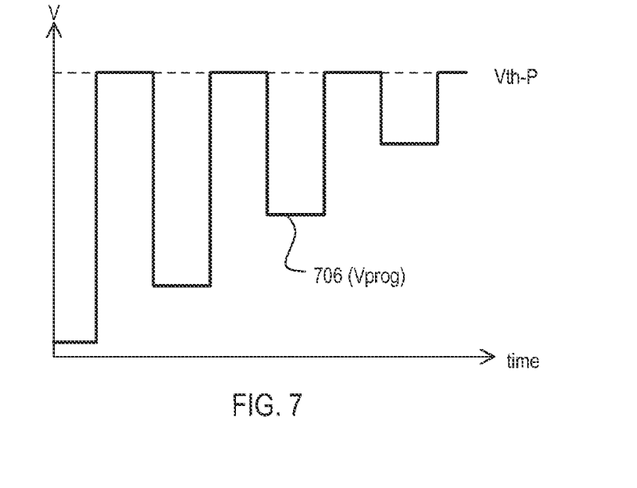
FIG. 7 is a diagram showing a programming voltage source according to another embodiment.

FIG. 7 is a diagram showing a programming voltage pulse (Vprog) 706 according to another embodiment. In FIG. 6, it is assumed that an element has a threshold voltage Vth-P.

A voltage of pulse 706 can include a sequence of negative going sections that decrease in amplitude as compared to positive going sections shown in FIG. 6.

Figure 8:
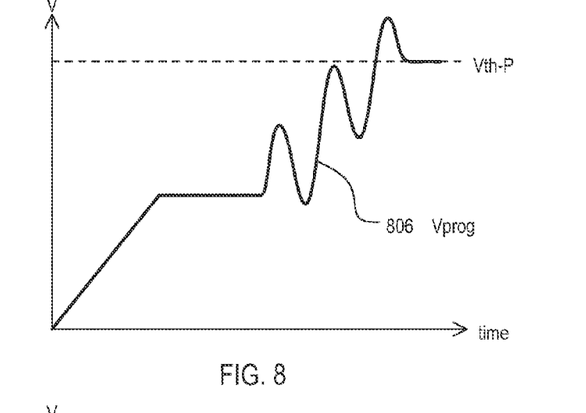
FIG. 8 is a diagram showing a programming voltage source according to another embodiment.

FIG. 8 is a diagram showing a programming voltage pulse (Vprog) 806 according to another embodiment. In FIG. 8, it is assumed that an element has a threshold voltage Vth-P.

A voltage of pulse 806 can include a portion that does not include a change in field direction (in this embodiment the leading portion does not include an AC-like signal component). Other embodiments can include other sections that do not have changes in field direction.

Figure 9:
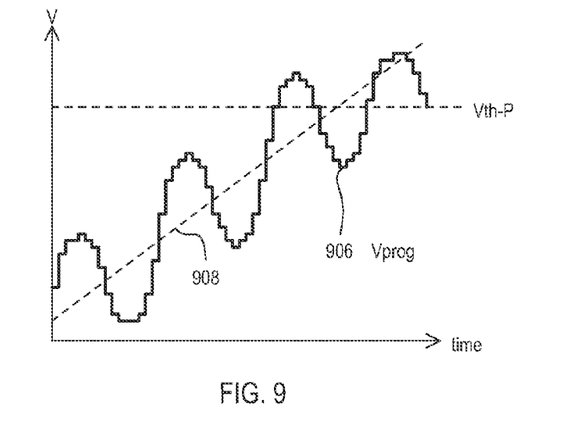
FIG. 9 is a diagram showing a programming voltage source according to another embodiment.

FIG. 9 is a diagram showing a programming voltage pulse (Vprog) 906 according to yet another embodiment. In FIG. 9, it is assumed that an element has a threshold voltage Vth-P.

A voltage of pulse 906 can include quantized portions. In one very particular embodiment, such a wave form can be generated by a digital-to-analog converter (DAC). In some embodiments, waveform smoothing techniques can be applied to a quantized waveform to generate a smoother waveform, like others of those described herein.

Figure 10:
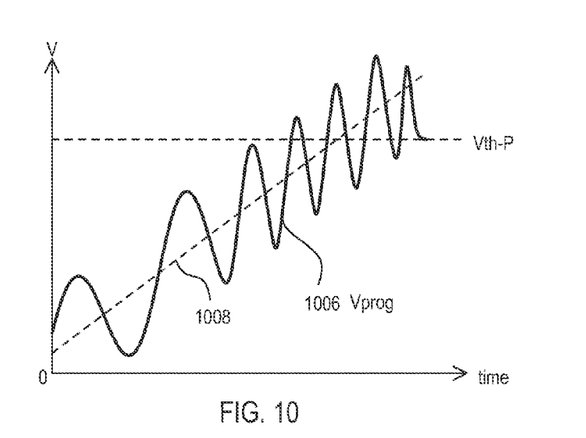
FIG. 10 is a diagram showing a programming voltage source according to another embodiment.

FIG. 10 is a diagram showing a programming voltage pulse (Vprog) 1006 according to another embodiment. In FIG. 10, it is assumed that an element has a threshold voltage Vth-P.

A voltage of pulse 1006 can include an AC component like that of FIG. 2. However, unlike FIG. 2, an AC component can vary in frequency (in this embodiment, increases in frequency). Other embodiments can include different changes in a frequency of an AC component (e.g., decreases and/or both increases and decreases).

Figure 11:
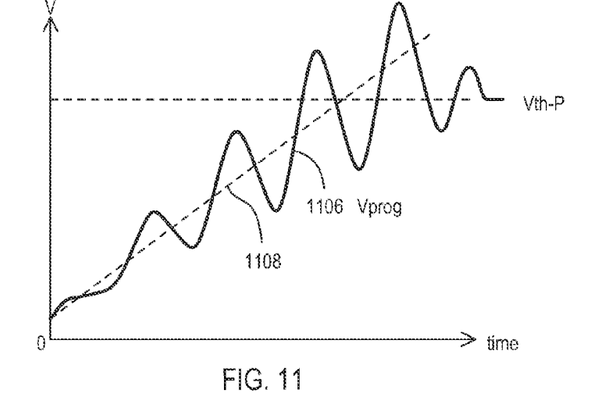
FIG. 11 is a diagram showing a programming voltage source according to another embodiment.

FIG. 11 is a diagram showing a programming voltage pulse (Vprog) 1106 according to another embodiment. In FIG. 11, it is assumed that an element has a threshold voltage Vth-P.

A voltage of pulse 1106 can include an AC component like that of FIG. 2. However, unlike FIG. 2, an AC component can vary in amplitude (in this embodiment, increases in amplitude). Other embodiments can include different changes in amplitude of an AC component (e.g., decreases and/or both increases and decreases).

Alternate embodiments can apply waveforms that mix the various features of the embodiments shown herein. Further, the above waveforms are but examples of programming pulses that can be applied to a memory element.

FIGS. 12A to 12E are diagrammatic representations of a programmable impedance element 1202 in response to programming pulses according to embodiments. An element 1202 can include a solid ion conducting later 1212 formed between a first electrode 1210 and a second electrode 1214. In the embodiment shown, a first electrode 1210 can be an active electrode formed from one or more metals that can ion conduct within ion conducting layer 1212.

Figure 12A:
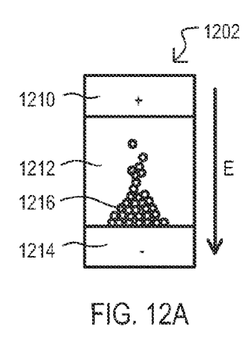
FIGS. 12A to 12E are diagrams showing a programmable impedance element response to programming pulses according to embodiments.

FIG. 12A shows a starting formation of a conductive filament 1216 by application of a pulse having an initial electric field (E) in a first direction. Atoms that make up filament 1216 can form structures in a non-preferred configuration.

Figure 12B:
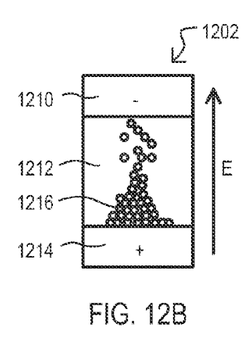

FIG. 12B shows a filament 1216 under a change in field direction of the same programming pulse. Atoms within filament 1216 can move out of non-preferred configurations.

Figure 12C:
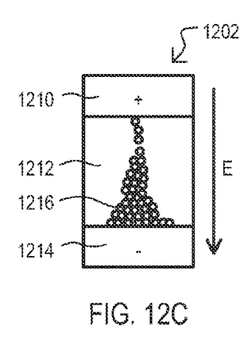

FIG. 12C shows a filament 1216 with a return to the field direction of FIG. 12A. A filament 1216 can continue to grow between the electrodes 1210/1214. Re-application of the field can result in more atoms moving into preferred configurations. In addition, new filament sections can be formed. It is noted that while a filament 1216 can form a conductive path between electrodes 1210/1214 (which conventionally could indicate successful programming), the filament 1216 could be subject to falling back into a higher resistance, as noted for FIG. 20E.

Figure 12D:
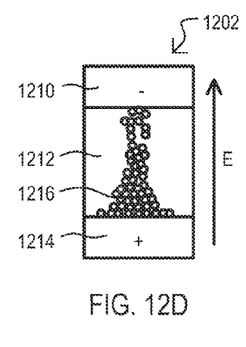

FIG. 12D shows a filament 1216 under another change in field direction of the same programming pulse. Atoms within filament 1216 can continue to be "wiggled", which may move some atoms out of non-preferred configuration positions.

Figure 12E:
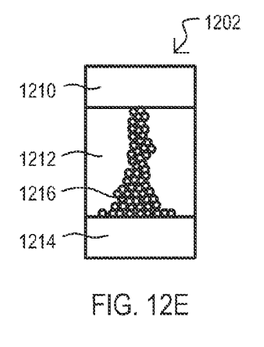

FIG. 12E shows a filament 1216 after a programming pulse(s), according to embodiments, have been applied. A filament 1216 can include atoms in preferred configurations, leading to a more stable filament, as compared to programming pulses that do not apply pulses with an AC type component.

Figure 13:
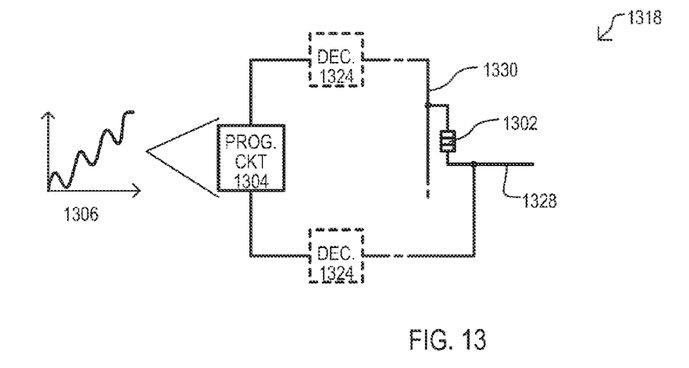
FIG. 13 is a block schematic diagram of a memory device according to another embodiment.

FIG. 13 is a block schematic diagram showing a memory device 1318 according to another embodiment. A memory device 1318 can include memory elements (one shown as 1302) having one terminal connected to a first conductive line 1330 (e.g., bit line) and another terminal connected to a second conductive line 1328 (e.g., word line).

A programming circuit 1304 can apply a time-varying programming pulse with an AC type component 1306 to memory element 1302, as described in embodiments herein. Optionally, programming circuit 1304 can apply a programming pulse 1306 through a decoding circuit 1324 which can select an element 1302 based on address data. A decoding circuit 1324 can provide a selectable path to either or both terminals of a memory element 1302.

FIG. 13 can be one implementation of a cross point type array programmable according to an embodiment.

Figure 14:
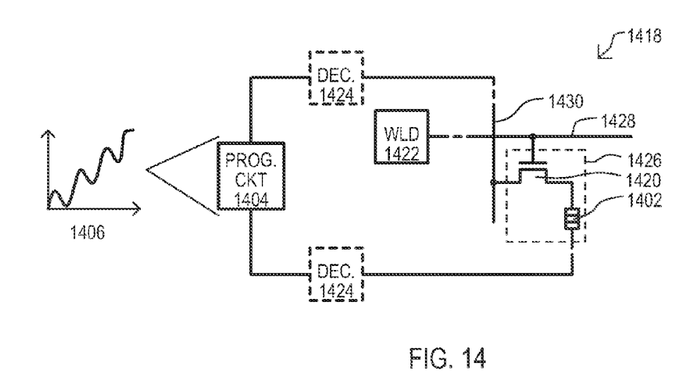
FIG. 14 is a block schematic diagram of a memory device according to a further embodiment.

FIG. 14 is a block schematic diagram of a memory device 1418 according to another embodiment. A memory device 1418 can include items like those of FIG. 13.

FIG. 14 differs from FIG. 13 in that a memory device 1418 can include memory cells (one shown as 1426) having an access device 1420 and a memory element 1402. Access device 1420 can have a controllable current path between a bit line 1430 and a first terminal of element 1402. A control terminal of access device 1420 can be connected to a word line 1428 driven by a word line driver 1422. In the embodiment shown, an access device 1420 can be an n-channel insulated gate field effect (e.g., MOS) transistor. However, additional embodiments can include other suitable access devices, including but not limited to, other types of transistors and/or diodes, or diode-like devices.

A programming circuit 1404 can apply a time-varying programming pulse with an AC type component 1406 to an element 1402 through the corresponding access device 1420. In the embodiment shown, a word line driver circuit 1422 does not substantially affect a shape of programming pulse 1406.

Figure 15:
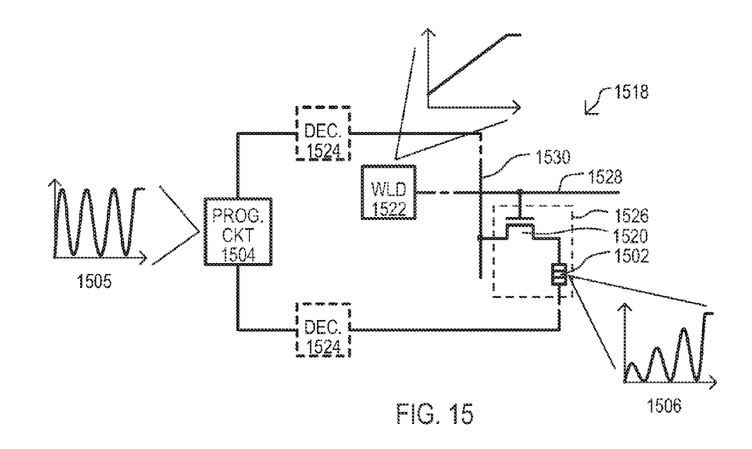
FIG. 15 is a block schematic diagram of a memory device according to another embodiment.

FIG. 15 is a block schematic diagram of a memory device 1518 according to another embodiment. A memory device 1518 can include items like those of FIG. 14.

FIG. 15 differs from FIG. 14 in that a word line driver 1522 can modulate a signal 1505 generated by a program circuit 1504 to create a program pulse 1506 across element 1502. In the particular embodiment shown, a word line driver 1522 can dynamically limit a voltage amplitude of a signal 1505 provided from program circuit 1504. In the particular embodiment shown, a word line driver 1522 can vary the amplitude of a voltage applied to a control terminal of an access device 1520.

It is understood that FIG. 15 shows but one way in which an access device can modulate a bit line signal to arrive at a time varying programming pulse with an AC like component.

While some embodiments can include programming circuits that apply programming signals based on an established element response (i.e., voltage threshold voltage), other embodiments can apply a programming signal based on an element response. In particular, in some embodiments, a programming signal can be adjusted based on a compliance limit. Examples of such embodiments are shown in FIGS. 16A and 16B.

Figure 16A:
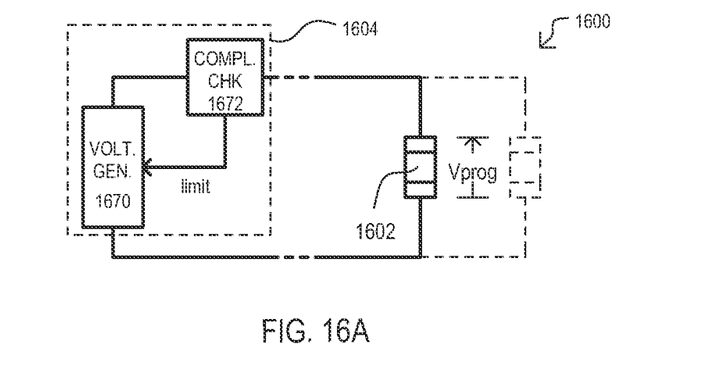
FIG. 16A is a block schematic diagram of a memory device according to another embodiment.

FIG. 16A is a block schematic diagram of a memory device 1600 according to an embodiment. A memory device 1600 can include a programming circuit 1604 which can program a selected memory element 1602. A programming circuit 1604 can include a voltage generator circuit 1670 and a compliance check circuit 1672. A voltage generator 1670 can apply a programming voltage to a selected memory element 1602 according to embodiments herein, or equivalents. In addition, a voltage generator 1670 can have operations controlled in response to an indication "limit" from compliance check circuit 1672.

A compliance check circuit 1672 can activate a limit indication in response to a monitored response (e.g., current, impedance, voltage) of memory element 1602 falling outside of some limit during the programming operation. In one embodiment, when a current drawn through a selected element 1602 exceeds a predetermined limit, a programming voltage can change. In other embodiments, when an impedance of a selected element 1602 falls outside a predetermined limit, a programming voltage can change.

Figure 16B:
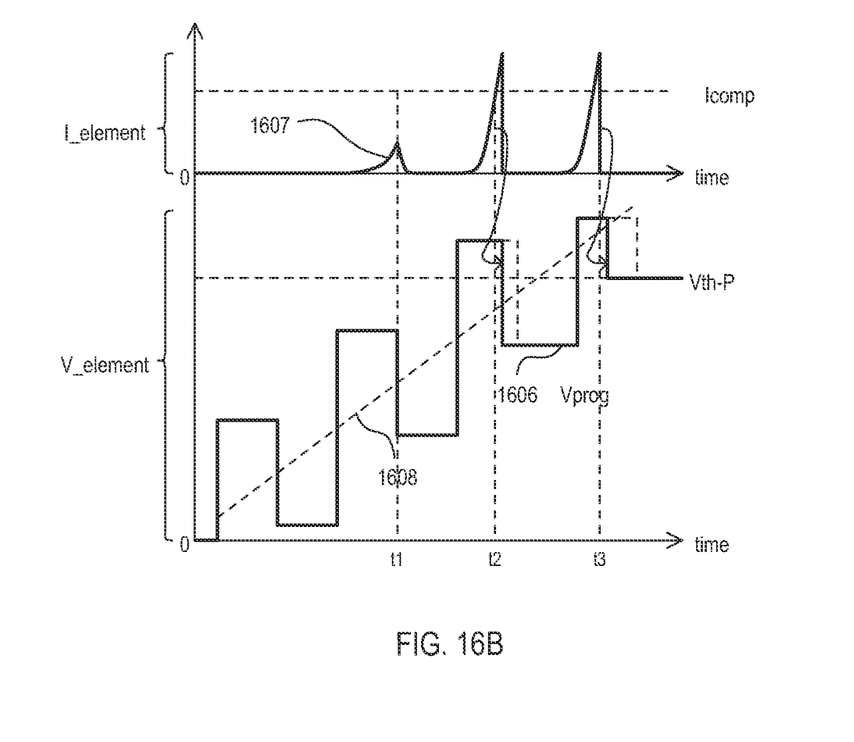
FIG. 16B is a timing diagram showing a programming operation for a memory device like that of FIG. 16A.

FIG. 16B is a timing diagram showing a programming operation for a device like that of FIG. 16A according to one particular embodiment. FIG. 16B shows a programming signal 1606 having a square wave AC component on a linearly increasing DC component 1608. FIG. 16B also shows a sensed value for a current drawn through an element (I_element) during the programming operation.

At time t1, in response to an applied voltage pulse, a current can be drawn through the element, but can be below a compliance limit (Icomp).

At time t2, in response to a subsequent voltage pulse (at a higher DC level), a current drawn through the element can exceed the limit (Icomp). This current level can be sensed by a compliance check circuit 1672, and in response, a voltage pulse can be terminated early.

A similar response occurs at time t3, with a voltage pulse being terminated early in response to a current through the element exceeding the compliance limit.

While FIG. 16B shows control of a programming operation in response to a sensed current, as understood, alternate embodiments can alter a programming operation of an element in response to some other feature, such as impedance of an element.

Further, it is understood that a compliance check circuit 1672 can monitor the response of one selected element and/or a group of elements.

Program circuits that generate a time varying program pulse according to embodiments herein can take various forms. Very particular program pulse generating circuits that can be included in embodiments will now be described.

Figure 17:
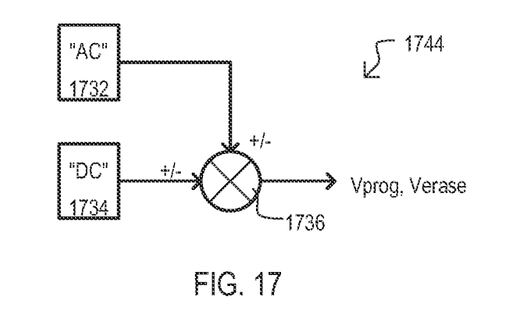
FIG. 17 is a block schematic diagram of a pulse generator circuit that can be included in embodiments.

FIG. 17 shows a pulse generating circuit 1744 that can be included in embodiments. A pulse generating circuit 1744 can include a mixer-type circuit 1736, an AC voltage source 1732, and a DC-type voltage source 1734.

A mixer-type circuit 1736 can combine an AC-type signal from source 1732 with a DC-type voltage from source 1734. It is understood that a DC-type voltage is not necessarily a constant voltage, but can be a voltage that changes at a substantially slower rate than the AC-type signal. The AC-type signal can vary in potential to induce rapid field changes across an element being programmed, as described herein.

Figure 18:
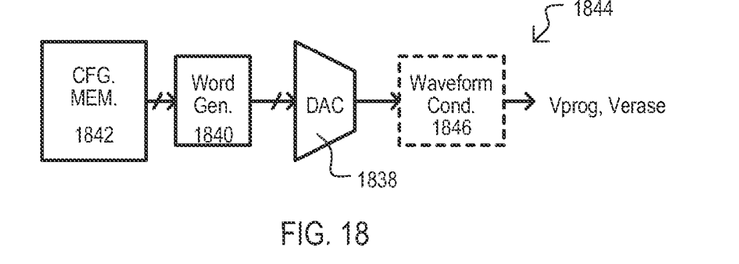
FIG. 18 is a block schematic diagram of another pulse generator circuit that can be included in embodiments.

FIG. 18 shows another pulse generating circuit 1844 that can be included in embodiments. A pulse generating circuit 1844 can include a digital-to-analog converter (DAC) 1838, and can generate a programming voltage waveform from digital values.

In the particular embodiment shown, a pulse generating circuit can include a data word generator 1840 and a configuration memory 1842. A data word generator 1840 can provide a sequence of multi-bit values to DAC 1838 for conversion into an output voltage waveform. A configuration memory 1842 can provide and/or modify values provided by data word generator 1840 to change or adjust resulting programming pulse(s).

Optionally, a pulse generating circuit 1844 can include a waveform conditioning circuit 1846 which can smooth out quantized sections output from DAC 1838.

Memory devices according to embodiments can program elements with program pulses having an AC component in standard data storing operations (e.g., program, erase). However, alternate embodiments may use programming pulses as described herein (e.g., having an AC component) for some operations, but use different pulses (e.g., conventional pulses) for standard operations. An example of such an embodiment is shown in FIG. 19.

Figure 19:
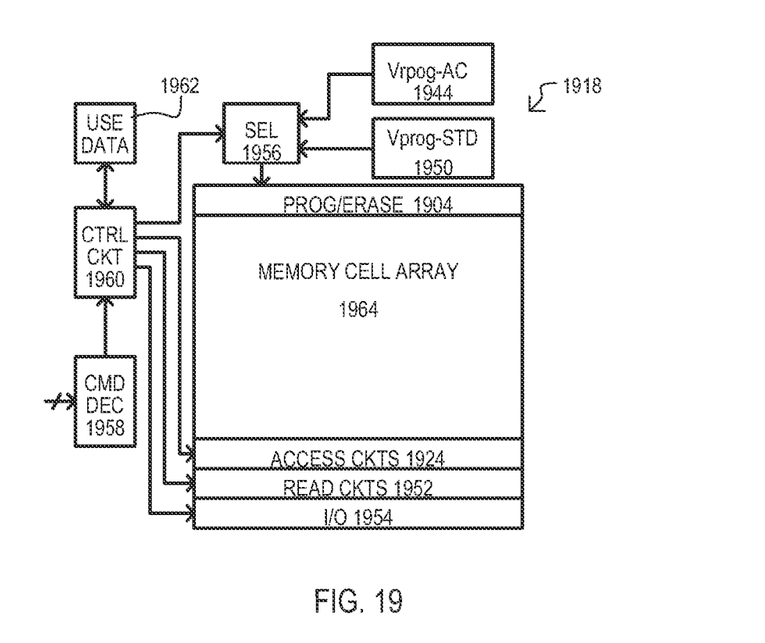
FIG. 19 is a block schematic diagram of a memory device according to an embodiment.

FIG. 19 shows a memory device 1918 that includes read circuits 1952, a memory cell array 1964, access circuits 1924, input/output (I/O) circuits 1954, standard programming voltage source 1950, AC-type programming voltage source 1944, a mode switch 1956, programming circuit 1904, a command decoder 1958, a control circuit 1960, and use data store 1962.

Read circuits 1952 can sense impedance states of selected memory cells within memory cell array 1964. In some embodiments, read circuits 1952 can include current sense amplifiers or voltage sense amplifiers.

A memory cell array 1964 can include a memory cells that each include one or more elements programmable between two or more impedance states, as described herein or equivalents. Memory cells in memory cell array 1964 can take various forms, including one-access device/one memory element (e.g., one transistor/one resistor (1T/1R)) described above. However, in some embodiments, memory cells may be composed of only one memory element (i.e., a cross point array type configuration). Still further, in other embodiments memory cells can include multiple transistors and/or multiple elements. As but a few examples, memory cells can be four transistor static RAM (RAM) cells with one or more memory elements serving as load devices in the latching cell.

Access circuits 1924 can enable read circuits 1952 to access selected memory cells within array 1964 in order to read data from such elements. In some embodiments, access circuits 1924 can enable programming circuits 1904 to access memory cells within memory cell array 1964 to write data into such memory cells by application of programming pulses. In some embodiments, access circuits 1924 can include row and/or column decoders.

I/O circuits 1954 can provide data paths into and out of memory cell array 1964. In some embodiments, I/O circuits 1954 can include a parallel interface for providing read data and/or receiving write data from sources external to the memory device 1918 in multiple bit widths. However, in other embodiments, I/O circuits 1954 can include one or more serial data paths.

Standard programming voltage source 1950 can provide standard programming voltage pulses of application to memory cells within memory cell array 1964 during standard modes of operation (e.g., data writes for subsequent read). In some embodiments, a standard programming voltage pulses can be conventional, and not include an AC-type component.

AC-type programming voltage source 1944 can provide programming voltage pulses having an AC-type component for application to memory cells within memory cell array 1964 in modes other than standard modes. Examples of such modes will be described below.

A mode switch 1956 can selectively apply either a standard programming pulse or an AC-like programming pulse to programming circuit 1904 in response to control signals from control circuit 1960. Programming circuit 1904 can apply a received programming pulse (AC-like or standard) to elements within memory cell array 1964.

A command decoder 1958 can decode received commands and provide command data to control circuit 1960. In some embodiments, such commands can include standard data write commands (e.g., program/erase), which can result in standard programming pulses being applied to elements, as well as other commands, which can apply programming pulses with AC-like components (AC-type programming pulses).

A use data store 1962 can store data indicating the programming history (or lack thereof) for elements of memory cell array 1964.

Control circuit 1960 can generate control signals for various other portions of memory device 1918. In particular embodiments, control circuit 1960 can control mode switch 1956 in response to commands received by command decoder 1958 and/or use data in use data store 1962.

Accordingly, in some embodiments, upon receiving standard write commands (e.g., program, erase), command decoder 1958 can provide standard command data to control circuit 1960, which can control mode switch 1956 to provide standard program pulses from standard programming voltage source 1950. In contrast, in response to a specialized command, command decoder 1958 can provide standard command data to control circuit 1960, which can cause control mode switch 1956 to provide program pulses from AC-type programming voltage source 1944.

In this way, a memory device can apply standard programming pulses in response to standard write command, and programming pulses with an AC-like component in response to special commands.

Further, in some embodiments, upon detecting particular use data, control circuit 1960 can cause mode switch 1956 to provide program pulses from AC-type programming voltage source 1944. In one very particular embodiment, upon detection of "fresh" memory elements (i.e., memory elements that have not been programmed) as indicated by use data store 1962, AC-type programming pulses can be applied. As but one example, such pulses can be a predetermined test pattern, or can be a first write of data. Such a write to fresh memory elements is sometime referred to as pre-conditioning.

In addition or alternatively, upon detection of a predetermined number of cycles as indicated by use data store 1962, AC-type programming pulses can be applied. Such a specialized write after a certain number of programming cycles is sometime referred to as re-conditioning.

Still further, control circuit 1960 can cause mode switch 1956 to provide program pulses from AC-type programming voltage source 1944 in response to other predetermined conditions. One such predetermined condition can be a power-on or reset state of the memory device 1918.

In this way, a memory device can apply AC-like programming pulses in a pre-conditioning and/or re-conditioning operation, or upon power-on or reset.

In some embodiments, an AC-like programming pulse can have an overall duration of 100 nanoseconds to 10 milliseconds. AC and AC like transitions can occur in smaller time frames within such pulses. In particular embodiments, AC transitions can occur at frequencies of 100 kHz or greater.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory device, comprising: a plurality of memory cells each comprising at least one programmable impedance memory element; a programming circuit coupled to the memory elements and configured to apply at least one time varying pulse to memory elements to place them into one of at least two different impedance states; and a programming voltage source coupled to the programming circuit configured to generate the at least one time varying pulse by combining a first AC voltage with a second voltage that increases in magnitude during the time varying pulse; wherein the time varying pulse decreases and increases in potential while having an overall increase in one voltage polarity.

2. The memory device of claim 1, wherein: the programming voltage source includes a mixer circuit configured to combine the first AC voltage with the second voltage.

3. The memory device of claim 1, wherein:
the programming voltage source includes a digital-to-analog converter (DAC).

4. The memory device of claim 3, further including:
a configuration memory; and
the DAC is coupled to the configuration memory and configured to adjust a shape of the time varying pulse in response to data from the configuration memory.

5. The memory device of claim 1, further including:
each memory cell includes an access device coupled to a memory element, and rows of memory cells have control terminals of their corresponding access device coupled to a word line; and
a word line driver circuit configured to drive a control terminal of access devices with varying voltage to generate the programming pulse.

6. The memory device of claim 1, further including:
the programming circuit is further configured to apply the time varying pulse or a standard pulse to the memory elements in response to control signals; and
a control circuit configured to generate the control signals.

7. The memory device of claim 6, wherein:
the control circuit is configured to generate the control signals in response to any selected from the group of: a command, a power on state, a reset state, a number of programming cycles performed on the element, or element performance.

8. The memory device of claim 1, further including:
a compliance check circuit that generates an indication when a response of at least one memory element being programmed falls outside a predetermined limit; and
the programming voltage source alters at least one pulse in response to an indication from the compliance check circuit.

9. The memory device of claim 1, wherein:
the programming circuit is configured to generate a time varying pulse having a duration of 100 ns to 10 ms, with transitions within the pulse occurring at a frequency of no less than 100 kHz.

10. A method, comprising: programming at least one element comprising a solid ion conductor from a second impedance to at least a first impedance by applying at least one time varying pulse over a programming period that decreases and increases in potential while having an overall increase in one voltage polarity over the programming period wherein the at least one pulse comprises an AC voltage component that repeatedly rises and falls throughout the programming period.

11. The method of claim 10, wherein: the at least one pulse further comprises a second voltage component that increases in magnitude throughout the programming period.

12. The method of claim 11, wherein:
the second voltage component is selected from the group of: a ramping voltage having a substantially constant increase in magnitude throughout the pulse and a multi-stepped voltage having at least two discrete increases in magnitude throughout the pulse.

13. The method of claim 10, wherein:
the AC voltage component has an amplitude that varies throughout the pulse.

14. The method of claim 10, wherein:
the AC voltage component is substantially periodic throughout the pulse.

15. The method of claim 10, wherein:
the solid ion conductor layer is selected from the group of: a chalcogenide and a metal oxide.

16. The memory device of claim 10, wherein:
the programming period is between 100 ns to 10 ms, with transitions within the pulse occurring at a frequency of no less than 100 kHz.

17. The method of claim 10, wherein:
the element forms part of a memory cell having at least one access device;
applying the at least one voltage pulse includes applying the time varying pulse through the access device; and
controlling a maximum magnitude of the at least one time varying pulse by controlling the conductivity of the access device.

18. The method of claim 10, further including:
programming the element by applying at least one time varying pulse is performed on a fresh element, a fresh element being an element that has not been previously programmed to any impedance state; and
after programming the fresh element with the at least one time varying pulse, programming the element with a standard programming pulse different from the time varying pulse.

19. The method of claim 10, further including:
programming the element by applying at least one time varying pulse is performed on an element in response to predetermined states of a memory device containing the element.

20. The method of claim 19, further including:
the predetermined states include any selected form the group of: receipt of a command, a power on state, a reset state, reaching a number of programming cycles performed on the element, and element performance falling below a predetermined value.

* * * * *